United States Patent
Walter et al.

(10) Patent No.: US 9,772,382 B2
(45) Date of Patent: Sep. 26, 2017

(54) METHOD FOR MONITORING A STATE OF A RECHARGEABLE BATTERY BASED ON A STATE VALUE WHICH CHARACTERIZES THE RESPECTIVE STATE OF THE RECHARGEABLE BATTERY

(71) Applicant: Robert Bosch GmbH, Stuttgart (DE)

(72) Inventors: Andreas Walter, Vaihingen (DE); Patrick Weiss, Remseck am Neckar (DE); Markus Waibler, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 377 days.

(21) Appl. No.: 14/284,610

(22) Filed: May 22, 2014

(65) Prior Publication Data

US 2014/0347058 A1    Nov. 27, 2014

(30) Foreign Application Priority Data

May 22, 2013    (DE) ................. 10 2013 209 389

(51) Int. Cl.
*H02J 7/00* (2006.01)
*H02J 7/04* (2006.01)
(Continued)

(52) U.S. Cl.
CPC ...... *G01R 31/3606* (2013.01); *B60L 11/1857* (2013.01); *B60L 11/1861* (2013.01); *G01R 31/3679* (2013.01); *B60L 2240/547* (2013.01); *Y02T 10/7011* (2013.01)

(58) Field of Classification Search
CPC ............... Y02E 60/12; G01R 31/3627; G01R 31/3648; G01R 31/3662; G01R 31/3631; G01R 31/3651; G01R 31/3624; G01R 31/3675; G01R 19/16542; G01R 31/3658; G01R 31/3682; G01R 31/3655; G01R 19/0092; G01R 19/2513; G01R 21/133; G01R 19/25; H02J 7/0047; H02J 7/0075; H02J 7/0073; H02J 7/008; H02J 7/0031;
(Continued)

(56) References Cited

U.S. PATENT DOCUMENTS

| | | | |
|---|---|---|---|
| 5,596,262 A | | 1/1997 | Boll |
| 5,672,953 A | * | 9/1997 | Kim ........................ H02J 7/008 320/163 |

(Continued)

*Primary Examiner* — Richard Isla Rodas
*Assistant Examiner* — Mohammed J Sharief
(74) *Attorney, Agent, or Firm* — Michael Best & Friedrich LLP

(57) ABSTRACT

A method for monitoring a state of a rechargeable battery based on a state value which characterizes the respective state of the rechargeable battery, characterized in that, during at least one time interval, an electrical energy which is output by the rechargeable battery and an electrical energy which is received by the rechargeable battery are detected, and in that an instantaneous state of charge or an instantaneous no-load voltage of the rechargeable battery is detected, wherein the detected electrical energy which is output by the rechargeable battery, the detected electrical energy which is received by the rechargeable battery and the respectively detected instantaneous state of charge or the respectively detected instantaneous no-load voltage of the rechargeable battery are evaluated in order to generate the state value.

10 Claims, 1 Drawing Sheet

(51) Int. Cl.
  *G01N 27/416* (2006.01)
  *G08B 21/00* (2006.01)
  *G01R 31/36* (2006.01)
  *G01R 19/00* (2006.01)
  *B60L 11/18* (2006.01)

(58) Field of Classification Search
  CPC .... H01M 10/44; H01M 10/48; G08B 29/181; G06F 1/3203
  USPC ........ 324/426, 427, 429; 320/132, 131, 149; 340/636.1, 636.12; 702/63, 64
  See application file for complete search history.

(56) References Cited

U.S. PATENT DOCUMENTS

| | | | |
|---|---|---|---|
| 6,211,653 B1* | 4/2001 | Stasko | G01R 31/361 320/132 |
| 6,366,054 B1* | 4/2002 | Hoenig | G01R 31/3631 320/132 |
| 7,233,128 B2* | 6/2007 | Brost | G01R 31/3648 320/132 |
| 8,200,388 B2* | 6/2012 | Otake | B60K 6/26 701/22 |
| 2007/0001679 A1 | 1/2007 | Cho et al. | |
| 2009/0295333 A1* | 12/2009 | Ryu | G01R 31/3624 320/134 |
| 2011/0257915 A1* | 10/2011 | Yamamoto | B60L 11/1861 702/63 |
| 2012/0136594 A1 | 5/2012 | Tang et al. | |
| 2012/0296586 A1 | 11/2012 | Kirchev | |
| 2014/0232411 A1* | 8/2014 | Vaidya | G01R 31/3624 324/426 |

\* cited by examiner

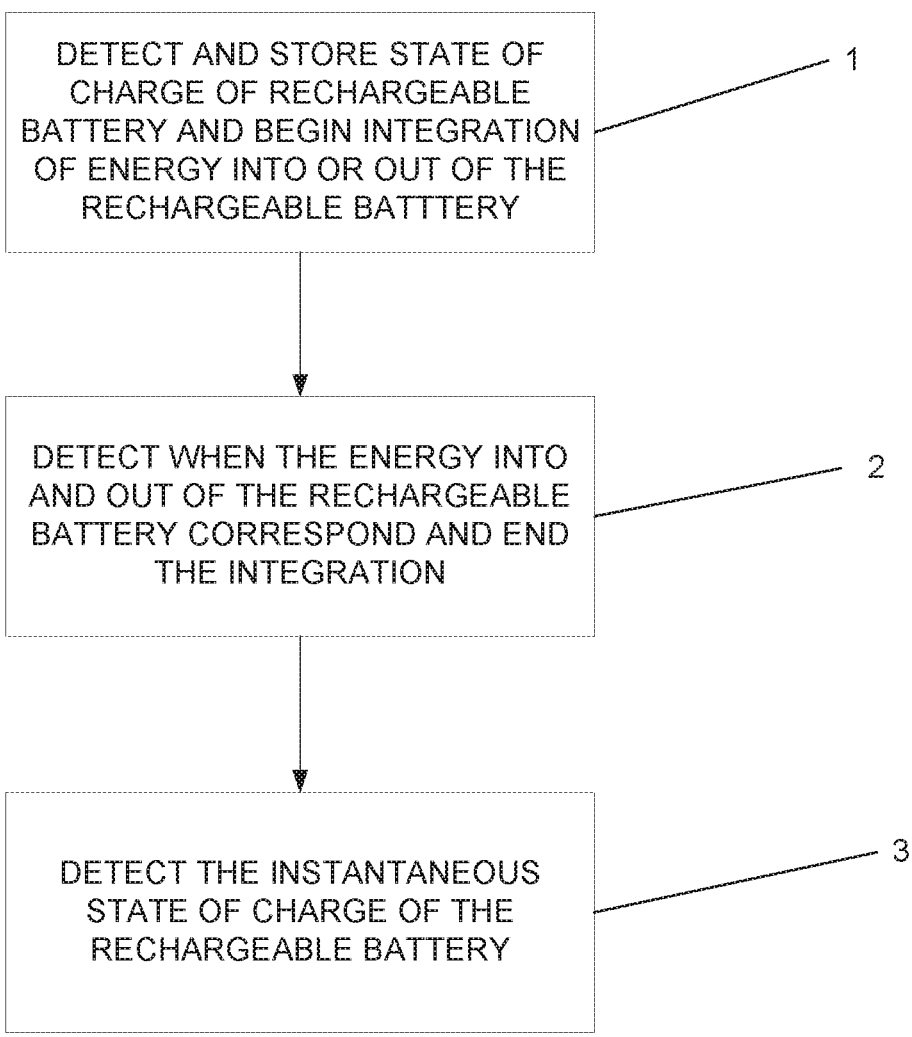

METHOD FOR MONITORING A STATE OF A RECHARGEABLE BATTERY BASED ON A STATE VALUE WHICH CHARACTERIZES THE RESPECTIVE STATE OF THE RECHARGEABLE BATTERY

BACKGROUND OF THE INVENTION

Rechargeable batteries are used in various technical fields. By way of example, it is known to use rechargeable batteries in a mobile manner in electrically driven motor vehicles, in particular electric motor vehicles and hybrid electric motor vehicles, in order to supply electrical energy to electrical drive devices of the motor vehicles using the rechargeable batteries. The rechargeable batteries used are often lithium-ion rechargeable batteries.

A conventional rechargeable battery can be formed by two or more rechargeable battery subunits which can each be formed by a combination of two or more rechargeable battery modules which are interconnected and which, in turn, can each have two or more interconnected rechargeable battery cells. Within the scope of the invention, the term "rechargeable battery" can be understood to mean a rechargeable battery of correspondingly conventional design, a rechargeable battery subunit, a rechargeable battery module or a rechargeable battery cell.

The capacity and performance of a rechargeable battery are reduced by damage to the rechargeable battery and with each charge/discharge cycle of the rechargeable battery, specifically until the rechargeable battery has to be replaced on account of a lack of performance and capacity. A falling capacity and performance of a rechargeable battery are associated with a reduction in the range of a motor vehicle which is equipped with said rechargeable battery and with an increase in the emissions which accompany operation of a motor vehicle of this kind. It is therefore important to monitor the state, in particular the state of aging, of a rechargeable battery as accurately as possible. In particular, it is necessary to know the state of a rechargeable battery for optimum operation of an electrically driven motor vehicle and also in order to comply with statutory requirements of a vehicle diagnosis system (so-called "on-board diagnosis"; OBD) during operation of a motor vehicle which is equipped with said rechargeable battery.

An aged rechargeable battery can no longer output the electrical energy which is stored in it at the same percentage at which a new rechargeable battery can. Furthermore, an aged rechargeable battery can only store a percentage of an electrical energy which is supplied to it which is lower than the percentage which a new rechargeable battery can store when the same electrical energy is supplied to it.

It is known to monitor the state of a rechargeable battery based on a state of health (SOH) which characterizes the functional capability of the rechargeable battery. In order to determine the SOH of a rechargeable battery, it is possible to calculate, for example, the electrical internal resistance of the rechargeable battery, which electrical internal resistance is evaluated in a characteristic map which contains, as additional input variables, the instantaneous state of charge (SOC) and the instantaneous temperature of the rechargeable battery. Corresponding determination of the SOH of a rechargeable battery can be found, for example, in WO 2007/004817 A1. The basis of this conventional type of determination of the state of a rechargeable battery is that it is assumed that the state of the rechargeable battery can be described solely by an increased electrical internal resistance of the rechargeable battery, and that the state of a rechargeable battery assumes a similar profile in all electrically driven motor vehicles. Therefore, only effects which increase the electrical internal resistance of a rechargeable battery are taken into account in this state determination process.

FR 2 955 670 A1 furthermore discloses a method for estimating the efficiency of a rechargeable battery, wherein, however, the method cannot be applied when an electrically driven motor vehicle which is equipped with said rechargeable battery is in driving mode, and therefore a method of this kind cannot meet the statutory requirements of a vehicle diagnosis system either.

SUMMARY OF THE INVENTION

The subject matter of the invention is a method for monitoring a state of a rechargeable battery, in particular a lithium-ion rechargeable battery, based on a state value which characterizes the respective state of the rechargeable battery, characterized in that, during at least one time interval, an electrical energy which is output by the rechargeable battery and an electrical energy which is received by the rechargeable battery are detected, and in that an instantaneous state of charge or an instantaneous no-load voltage of the rechargeable battery is detected, wherein the detected electrical energy which is output by the rechargeable battery, the detected electrical energy which is received by the rechargeable battery and the respectively detected instantaneous state of charge or the respectively detected instantaneous no-load voltage of the rechargeable battery are evaluated in order to generate the state value.

Since, in order to generate the state value, the detected electrical energy which is output by the rechargeable battery, the detected electrical energy which is received by the rechargeable battery and the respectively detected instantaneous state of charge or the respectively detected instantaneous no-load voltage of the rechargeable battery are evaluated, electrochemical and/or electrical effects, for example, which manifest in a complex, dynamic impedance, can be taken into account during the generation of the state value, this not being possible in the case of the conventional determination of the SOH of a rechargeable battery. In addition, state-changing effects can be detected by the method according to the invention, said state-changing effects occurring only under dynamic loads, but not being expressed in an increased internal resistance of the rechargeable battery. The method according to the invention can therefore also meet relatively strict statutory requirements which require that corresponding effects are taken into account.

The state of a rechargeable battery can therefore be monitored in a highly accurate manner using the method according to the invention, this allowing, for example, more accurate calculation of the range of a correspondingly operated motor vehicle which can be electrically driven and also more efficient calculation of the operating strategy of a hybrid electric motor vehicle which is operated in a corresponding manner.

With preference, no additional devices are required to carry out the method according to the invention, but rather devices which are already present in the motor vehicle are applied following corresponding programming.

In order to detect the electrical energy which is output or received by the rechargeable battery, the electric current which flows out of or into the rechargeable battery is preferably detected by means of current sensors and, as a product with the instantaneously detected electrical voltage which is generated by the rechargeable battery, integrated with respect to time.

According to an advantageous refinement, the end of the time interval is defined by the time at which the magnitude of the received electrical energy corresponds to the magnitude of the output electrical energy, wherein, after the end of the time interval, the difference between the detected instantaneous state of charge or the detected instantaneous no-load voltage of the rechargeable battery at the beginning of the time interval and the detected instantaneous state of charge or the detected instantaneous no-load voltage of the rechargeable battery at the end of the time interval is divided by the sum of the magnitudes of the detected electrical energy which is received by the rechargeable battery and the detected electrical energy which is output by the rechargeable battery. To this end, in particular, the detected instantaneous state of charge or the detected instantaneous no-load voltage of the rechargeable battery at the beginning of the time interval is stored in order to be available for calculating the difference after the time interval. During operation of a correspondingly operated motor vehicle, a large number of different states of charge of the rechargeable battery are run through since the rechargeable battery not only outputs charge but is also charged, for example by recuperation or external charging. In this case, the sum of the integral of the electrical energy which is received by the rechargeable battery and the integral of the electrical energy which is output by the rechargeable battery reaches the value zero at a specific time, specifically when the magnitude of the electrical energy which is received by the rechargeable battery corresponds to the magnitude of the electrical energy which is output by the rechargeable battery. Owing to the losses which occur in this case due to an aged rechargeable battery, the rechargeable battery is, however, at this time no longer in a state of charge which is identical to the state of charge of the rechargeable battery at the beginning of the implemented integration operations. For example, a rechargeable battery can have a calculated state of charge of 60% at the beginning of the integration operations. At the end of the integration operations, the rechargeable battery can have, for example, a state of charge of 50%. Therefore, a characteristic state value for the state of the rechargeable battery can be obtained when the change in the state of charge of the rechargeable battery is divided by the sum of the magnitudes of the detected electrical energy which is received by the rechargeable battery and the detected electrical energy which is output by the rechargeable battery.

According to an alternative advantageous refinement, the end of the time interval is defined by the time at which the instantaneous state of charge which is detected after the beginning of the time interval or the instantaneous no-load voltage of the rechargeable battery which is detected after the beginning of the time interval corresponds to the detected instantaneous state of charge or the detected instantaneous no-load voltage of the rechargeable battery at the beginning of the time interval, wherein, after the end of the time interval, the difference between the magnitudes of the detected electrical energy which is received by the rechargeable battery and the detected electrical energy which is output by the rechargeable battery is divided by the sum of the magnitudes of the detected electrical energy which is received by the rechargeable battery and the detected electrical energy which is output by the rechargeable battery. To this end, in particular, the detected instantaneous state of charge or the detected instantaneous no-load voltage of the rechargeable battery at the beginning of the time interval is stored in order to be available for the comparison with the instantaneously detected state of charge of the rechargeable battery. According to this refinement, after the beginning of the integration operations, there is a period of waiting until the detected instantaneous state of charge of the rechargeable battery again reaches the state of charge of the rechargeable battery which is stored and detected at the beginning of the time interval. Owing to the effects of a finite efficiency of the rechargeable battery, the magnitude of the electrical energy which is received by the rechargeable battery then does not correspond to the magnitude of the electrical energy which is output by the rechargeable battery. It is possible to obtain a characteristic state value for the state of the rechargeable battery when the difference between the magnitudes of the detected electrical energy which is received by the rechargeable battery and the detected electrical energy which is output by the rechargeable battery is divided by the sum of the magnitudes of the detected electrical energy which is received by the rechargeable battery and the detected electrical energy which is output by the rechargeable battery.

According to a further advantageous refinement, the respectively detected instantaneous state of charge or the respectively detected instantaneous no-load voltage is compared with a predefinable state of charge value or no-load voltage value, wherein the beginning of the time interval is defined by a time at which the detected instantaneous state of charge or the detected instantaneous no-load voltage of the rechargeable battery exceeds or falls below the predefinable state of charge value or no-load voltage value. If the respectively detected instantaneous state of charge or the respectively detected instantaneous no-load voltage exceeds or falls below the predefinable state of charge value or no-load voltage value, the conclusion can be drawn from this that the rechargeable battery has aged by a specific amount and should be replaced, for example. The value of the predefinable state of charge value or no-load voltage value can be ascertained in a simulated or experimental manner.

A further advantageous refinement makes provision for the beginning of each time interval to be defined by a predefinable start time, wherein the time difference between immediately successive start times is the same. This allows permanent monitoring of the state of the rechargeable battery, this monitoring being independent of further factors.

It is further considered to be advantageous when the electrical energy which is output by the rechargeable battery, the electrical energy which is received by the rechargeable battery and the instantaneous state of charge or the instantaneous no-load voltage of the rechargeable battery are detected in at least two time intervals which partly overlap in respect of time, wherein each time interval is followed by an evaluation of the detected electrical energy which is output by the rechargeable battery, the detected electrical energy which is received by the rechargeable battery and the respectively detected instantaneous state of charge or the respectively detected instantaneous no-load voltage of the rechargeable battery. As a result, the density of state values is increased, this making it possible to monitor the state of the rechargeable battery in an accurate and reliable manner.

A further subject matter of the invention is a rechargeable battery system comprising at least one rechargeable battery and an electronic device for monitoring a state of the rechargeable battery, wherein the electronic device is designed to detect an electrical energy which is output by the rechargeable battery, an electrical energy which is received by the rechargeable battery and an instantaneous state of charge of the rechargeable battery, characterized in that the electronic device is designed to carry out the method according to one of the abovementioned refinements or any desired combination of said refinements. The abovementioned advantages are associated with said rechargeable battery system.

BRIEF DESCRIPTION OF THE DRAWINGS

The invention will be explained by way of example with reference to the appended FIGURE using a preferred exemplary embodiment, wherein the features described below can represent an aspect of the invention both on their own and in various combinations with one another. In the drawing FIG. 1: shows a schematic illustration of an exemplary course of the method according to the invention.

DETAILED DESCRIPTION

FIG. 1 shows a schematic illustration of an exemplary course of the method according to the invention. In step 1, the electric current which flows into the or out of the rechargeable battery and the electrical voltage which is generated by the rechargeable battery and also the beginning of the detection of the electrical energy which is received by the rechargeable battery or of the electrical energy which is output by the rechargeable battery are detected by the respective integration of the product of the detected electric current and the detected electrical voltage over time within one time interval. At the beginning of this time interval or this integration operation, the state of charge of the rechargeable battery is additionally detected and stored. In step 2, detection is performed to determine when the magnitude of the electrical energy which is output by the rechargeable battery corresponds to the magnitude of the electrical energy which is received by the rechargeable battery. If this is the case, the time interval ends or the integration operations are terminated and the resulting magnitudes of the electrical energies are added to one another in step 3. Furthermore, the instantaneous state of charge of the rechargeable battery is once again detected at the end of the time interval. Finally, in step 3, the current state value is ascertained from the quotient of the difference between the state of charge of the rechargeable battery which is detected at the beginning of the time interval and the state of charge of the rechargeable battery which is detected at the end of the time interval on one hand and the sum of the magnitudes of the detected electrical energies on the other hand.

According to an alternative embodiment, in step 2, detection is performed to determine when the instantaneously detected state of charge of the rechargeable battery corresponds to the state of charge at the beginning of the time interval. If this is the case, the time interval ends or the integration operations are terminated and the resulting magnitudes of the electrical energies are added to one another in step 3. Finally, in step 3, the current state value is ascertained from the quotient of the difference between the magnitude of the electrical energy which is received by the rechargeable battery and the magnitude of the electrical energy which is output by the rechargeable battery on the one hand and the sum of the magnitudes of the detected electrical energies on the other hand.

The invention claimed is:

1. A method for monitoring a state of a rechargeable battery based on a state value which characterizes a respective state of the rechargeable battery, comprising:

detecting, during at least one time interval, an electrical energy which is output by the rechargeable battery and an electrical energy which is received by the rechargeable battery, and detecting an instantaneous state of charge or an instantaneous no-load voltage of the rechargeable battery, wherein the detected electrical energy which is output by the rechargeable battery, the detected electrical energy which is received by the rechargeable battery and the respectively detected instantaneous state of charge or the respectively detected instantaneous no-load voltage of the rechargeable battery are evaluated in order to generate the state value, and altering operation of a vehicle based on the state value;

wherein a beginning of each time interval is defined by a predefinable start time, wherein a time difference between immediately successive start times is the same;

wherein an end of the time interval is defined by the time at which the instantaneous state of charge which is detected after a beginning of the time interval or the instantaneous no-load voltage of the rechargeable battery which is detected after the beginning of the time interval corresponds to the detected instantaneous state of charge or the detected instantaneous no-load voltage of the rechargeable battery at the beginning of the time interval, wherein, after the end of the time interval, a difference between the magnitudes of the detected electrical energy which is received by the rechargeable battery and the detected electrical energy which is output by the rechargeable battery is divided by a sum of the magnitudes of the detected electrical energy which is received by the rechargeable battery and the detected electrical energy which is output by the rechargeable battery; and wherein the electrical energy which is output by the rechargeable battery, the electrical energy which is received by the rechargeable battery and the instantaneous state of charge or the instantaneous no-load voltage of the rechargeable battery are detected in at least two time intervals which partly overlap in respect of time, wherein each time interval is followed by an evaluation of the detected electrical energy which is output by the rechargeable battery, the detected electrical energy which is received by the rechargeable battery and the respectively detected instantaneous state of charge or the respectively detected instantaneous no-load voltage of the rechargeable battery.

2. The method according to claim 1, characterized in that an end of the time interval is defined by the time at which a magnitude of the received electrical energy corresponds to a magnitude of the output electrical energy, wherein, after the end of the time interval, a difference between the detected instantaneous state of charge or the detected instantaneous no-load voltage of the rechargeable battery at a beginning of the time interval and the detected instantaneous state of charge or the detected instantaneous no-load voltage of the rechargeable battery at the end of the time interval is divided by a sum of the magnitudes of the detected electrical energy which is received by the rechargeable battery and the detected electrical energy which is output by the rechargeable battery.

3. The method according to claim 2, characterized in that the respectively detected instantaneous state of charge or the respectively detected instantaneous no-load voltage is compared with a predefinable state of charge value or no-load voltage value, wherein a beginning of the time interval is defined by a time at which the detected instantaneous state of charge or the detected instantaneous no-load voltage of the rechargeable battery exceeds or falls below the predefinable state of charge value or no-load voltage value.

4. The method according to claim 3, characterized in that a beginning of each time interval is defined by a predefinable start time, wherein a time difference between immediately successive start times is the same.

5. The method according to claim 4, characterized in that the electrical energy which is output by the rechargeable battery, the electrical energy which is received by the rechargeable battery and the instantaneous state of charge or the instantaneous no-load voltage of the rechargeable battery are detected in at least two time intervals which partly overlap in respect of time, wherein each time interval is followed by an evaluation of the detected electrical energy which is output by the rechargeable battery, the detected electrical energy which is received by the rechargeable battery and the respectively detected instantaneous state of charge or the respectively detected instantaneous no-load voltage of the rechargeable battery.

6. The method according to claim 1, characterized in that the respectively detected instantaneous state of charge or the respectively detected instantaneous no-load voltage is compared with a predefinable state of charge value or no-load voltage value, wherein a beginning of the time interval is defined by a time at which the detected instantaneous state of charge or the detected instantaneous no-load voltage of the rechargeable battery exceeds or falls below the predefinable state of charge value or no-load voltage value.

7. A rechargeable battery system comprising at least one rechargeable battery and an electronic device for monitoring a state of the rechargeable battery, wherein the electronic device is designed to detect an electrical energy which is output by the rechargeable battery, an electrical energy which is received by the rechargeable battery and an instantaneous state of charge of the rechargeable battery, characterized in that the electronic device is configured to carry out the method according to claim 1.

8. The method according to claim 1, characterized in that the respectively detected instantaneous state of charge or the respectively detected instantaneous no-load voltage is compared with a predefinable state of charge value or no-load voltage value, wherein a beginning of the time interval is defined by a time at which the detected instantaneous state of charge or the detected instantaneous no-load voltage of the rechargeable battery exceeds or falls below the predefinable state of charge value or no-load voltage value.

9. The method according to claim 8, characterized in that a beginning of each time interval is defined by a predefinable start time, wherein a time difference between immediately successive start times is the same.

10. The method according to claim 9, characterized in that the electrical energy which is output by the rechargeable battery, the electrical energy which is received by the rechargeable battery and the instantaneous state of charge or the instantaneous no-load voltage of the rechargeable battery are detected in at least two time intervals which partly overlap in respect of time, wherein each time interval is followed by an evaluation of the detected electrical energy which is output by the rechargeable battery, the detected electrical energy which is received by the rechargeable battery and the respectively detected instantaneous state of charge or the respectively detected instantaneous no-load voltage of the rechargeable battery.

* * * * *